(12) United States Patent
Simonson et al.

(10) Patent No.: US 10,418,805 B2
(45) Date of Patent: Sep. 17, 2019

(54) INRUSH CONTROL WITH MULTIPLE SWITCHES

(71) Applicant: Linear Technology LLC, Milpitas, CA (US)

(72) Inventors: Joshua John Simonson, Sunol, CA (US); David Henry Soo, Los Altos, CA (US); Christopher Bruce Umminger, Mountain View, CA (US)

(73) Assignee: Linear Technology LLC, Milpitas, CA (US)

( * ) Notice: Subject to any disclaimer, the term of this patent is extended or adjusted under 35 U.S.C. 154(b) by 0 days.

(21) Appl. No.: 16/010,283

(22) Filed: Jun. 15, 2018

(65) Prior Publication Data

US 2018/0294646 A1 Oct. 11, 2018

Related U.S. Application Data

(63) Continuation of application No. 14/300,999, filed on Jun. 10, 2014, now Pat. No. 10,003,190.

(Continued)

(51) Int. Cl.
*H02H 3/02* (2006.01)
*H02H 9/00* (2006.01)
(Continued)

(52) U.S. Cl.
CPC .......... *H02H 9/025* (2013.01); *H02H 9/001* (2013.01); *H02H 9/004* (2013.01); *H03K 17/167* (2013.01); *H02H 3/025* (2013.01)

(58) Field of Classification Search
CPC .......... H02H 9/025; H02H 9/004; H02H 9/04
(Continued)

(56) References Cited

U.S. PATENT DOCUMENTS 2,030,844 A 2/1936 Stanley
5,428,267 A 6/1995 Agiman
(Continued)

FOREIGN PATENT DOCUMENTS

CN 101217252 A 7/2008
CN 101217262 A 7/2008
(Continued)

OTHER PUBLICATIONS

LTC4226 "Wide Operating Range Dual Hot Swap Controller," Linear Technology, 24 pages, retrieved from http://cds.linear.com/docs/en.datasheet/4226f.pdf, downloaded on Jun. 10, 2014.
(Continued)

*Primary Examiner* — Dharti H Patel
(74) *Attorney, Agent, or Firm* — Schwegman Lundberg & Woessner, P.A.

(57) ABSTRACT

A novel system is offered for supplying power from an input node to a load coupled to an output node. The system may have multiple switches coupled between the input node and the output node. One or more limiting circuits may be configured for controlling the switches so as to limit outputs of the switches. For example, the limiting circuits may limit current through the respective switches. One or more timers may set a delay period for indicating a fault condition after the limiting is initiated.

22 Claims, 4 Drawing Sheets

Related U.S. Application Data

(60) Provisional application No. 61/845,491, filed on Jul. 12, 2013.

(51) Int. Cl.
    *H02H 9/02*     (2006.01)
    *H03K 17/16*     (2006.01)

(58) Field of Classification Search
    USPC ........................................................ 361/93.7
    See application file for complete search history.

(56) References Cited

U.S. PATENT DOCUMENTS

| | | | |
|---|---|---|---|
| 5,491,401 | A | 2/1996 | Inoue et al. |
| 5,698,973 | A | 12/1997 | Goerke et al. |
| 7,035,071 | B1 | 4/2006 | Tiew et al. |
| 7,957,116 | B2 | 6/2011 | So |
| 8,879,227 | B2 | 11/2014 | Nakahara |
| 10,003,190 | B2 | 6/2018 | Simonson et al. |
| 2001/0028571 | A1 | 10/2001 | Hanada et al. |
| 2002/0141125 | A1 | 10/2002 | Stafford |
| 2004/0123314 | A1 | 6/2004 | Bova |
| 2006/0012932 | A1* | 1/2006 | Kitagawa ............... H02H 3/087 361/93.1 |
| 2006/0250742 | A1 | 11/2006 | Fichera |
| 2008/0043393 | A1 | 2/2008 | Petkov |
| 2009/0189583 | A1 | 7/2009 | Kawase et al. |
| 2009/0257162 | A1 | 10/2009 | Garrett |
| 2013/0088278 | A1 | 4/2013 | Spalding, Jr. et al. |
| 2015/0016005 | A1 | 1/2015 | Simonson et al. |

FOREIGN PATENT DOCUMENTS

| | | |
|---|---|---|
| EP | 2852018 A2 | 3/2015 |
| JP | H 07-121252 A | 5/1995 |
| JP | H 08-97710 A | 4/1996 |
| JP | H 10-41797 A | 2/1998 |
| JP | 2001298861 A | 10/2001 |
| JP | 2004-185406 A | 7/2004 |
| JP | 2010-517500 A | 5/2010 |
| JP | 2015029264 A | 2/2015 |
| TW | 201010229 A | 3/2010 |
| TW | I637572 B | 10/2018 |
| TW | 201904157 A | 1/2019 |
| WO | WO-2008/088755 A2 | 7/2008 |

OTHER PUBLICATIONS

Chinese Office Action from Chinese Patent Application No. 201410329021.8 dated Sep. 29, 2017, 20 pages.

Partial European Search Report from European Patent Application No. 14002344.1, dated Jan. 28, 2015.

Extended European Search Report from European Patent Application No. 14002344.1, dated Jun. 19, 2015.

European Office Action from European Patent Application No. 14002344.1, dated Oct. 25, 2017, 4 pages.

Taiwanese Office Action from Taiwanese Patent Application No. 103123811, dated Jan. 16, 2018, 13 pages.

"U.S. Appl. No. 14/300,999, 312 Amendment filed Jan. 10, 2018", 8 pgs.

"U.S. Appl. No. 14/300,999, Final Office Action dated Jun. 13, 2017", 10 pgs.

"U.S. Appl. No. 14/300,999, Non Final Office Action dated May 26, 2016", 9 pgs.

"U.S. Appl. No. 14/300,999, Notice of allowance dated Feb. 21, 2018", 9 pgs.

"U.S. Appl. No. 14/300,999, Notice of allowance dated Oct. 11, 2017", 8 pgs.

"U.S. Appl. No. 14/300,999, Response filed Jul. 12, 2016 to Non Final Office Action dated May 26, 2016", 10 pgs.

"U.S. Appl. No. 14/300,999, Response filed Sep. 13, 2017 to Final Office Action dated Jun. 13, 2017", 9 pgs.

"U.S. Appl. No. 14/300,999, Supplemental Notice of Allowability dated Apr. 2, 2018", 2 pgs.

"U.S. Appl. No. 14/300,999, Supplemental Notice of Allowability dated Oct. 31, 2017", 2 pgs.

"U.S. Appl. No. 14/300,999, Supplemental Notice of Allowability dated Nov. 20, 2017", 2 pgs.

"U.S. Appl. No. 14/300,999, Supplemental Notice of Allowability dated Dec. 19, 2017", 2 pgs.

"Chinese Application Serial No. 201410329021.8, Office Action dated May 29, 2018", w/ English translation, 8 pgs.

"European Application Serial No. 14002344.1, Response filed Jan. 22, 2016 to Extended European Search Report dated Jun. 19, 2015", 17 pgs.

"European Application Serial No. 14002344.1, Response filed Mar. 2, 2018 to Communication pursuant to Article 94(3) EPC dated Oct. 25, 2017", 12 pgs.

"Japanese Application Serial No. 2014-137399, Office Action dated Jul. 3, 2018", w/ English Translation, 11 pgs.

"Japanese Application Serial No. 2014-137399, Response filed Dec. 3, 2018 to Office Action dated Jul. 3, 2018", 8 pgs.

"Japanese Application Serial No. 2014-137399, Final Notification of Reasons for Rejection dated Jun 4, 2019", w/ English Translation, 6 pgs.

"Taiwanese Application Serial No. 107125857, Office Action dated May 23, 2019", w/ English Translation, 4 pgs.

\* cited by examiner

INRUSH CONTROL WITH MULTIPLE SWITCHES

CROSS-REFERENCE TO RELATED APPLICATIONS

This application is a continuation application of U.S. application Ser. No. 14/300,999, entitled "INRUSH CONTROL WITH MULTIPLE SWITCHES," filed on Jun. 10, 2014, now issued U.S. Pat. No. 10,003,190, which is a nonprovisional application of U.S. Provisional Application Ser. No. 61/845,491, entitled "INRUSH CONTROL WITH MULTIPLE SWITCHES," filed on Jul. 12, 2013, the entirety of each of which is incorporated herein by reference.

TECHNICAL FIELD

This disclosure generally relates to circuits for limiting inrush currents and fault currents in electrical systems. In particular, the disclosure presents ways to operate multiple switches in parallel to limit inrush currents and fault currents in high power systems.

BACKGROUND

A hot-swap circuit applies power from an input source to a load in a controlled and protected fashion. One function of such a controller is to limit inrush currents from the power source to the load, especially load capacitance, when power is first applied or if the power source voltage suddenly increases. Another function is to limit current if the load attempts to draw too much current, for example if there is a short circuit in the load.

FIG. 1 shows a conventional hot-swap circuit that uses a single MOSFET 100 (Q1) in series with a current sense resistor 102 (RS1) along with control circuitry for limiting current. Numerous such circuits are commercially available. When limiting current, a current limit amplifier 104 adjusts the MOSFET gate to source voltage in order to limit the voltage across the current sense resistor 102 and thus the current through the MOSFET 100. The current limit amplifier 104 compares a voltage representing the current in the current sense resistor 102 with a voltage VLIMIT produced by a voltage source 106 to control the gate of the MOSFET 100 so as to reduce the output current when the sensed current exceeds a maximum value established by the voltage VLIMIT. A current source 108 is provided for pulling up the gate voltage. A transistor 110 is provided for turning the hot swap circuit on or off.

During this time, the voltage and current through the MOSFET 100 can both be large, resulting in high power dissipation in the MOSFET 100. If this power dissipation persists, the MOSFET 100 can reach temperatures that cause damage. MOSFET manufacturers present the safe limits on MOSFET voltage, current and time, as a curve referred to as Safe Operating Area (SOA). Commonly, a timer circuit 112 sets a maximum time the MOSFET will operate in current limit. The timer circuit 112 is coupled to the status pin of the current limit amplifier 104 to detect the time moment when the current limit amplifier 104 begins limiting the current. When the delay period set by the timer circuit 112 expires, the MOSFET 100 is turned off to protect it from overheating. The load will lose power and the hot swap controller will indicate that a fault has occurred.

Often high power hot-swap applications need to charge large bypass capacitors 126 ($C_L$) across the load. To reduce stress on the MOSFET 100, the load may be kept off until the bypass capacitors 126 are charged. A small charging current for the capacitance keeps the power in the MOSFET 100 low enough to prevent a dangerous rise in temperature. One method to reduce the charging current uses a capacitor 125 coupled between the MOSFET gate and ground to limit the voltage slew rate of the gate pin. The gate voltage is pulled up by a current from the current source 108 commonly in the range of 10-50 µA. The MOSFET 100 acts as a source follower while charging the load capacitance. Another method uses the current limit amplifier 104 to set the current charging the load capacitance. Either method can lower the inrush current such that the startup period stays within the SOA of the MOSFET 100. When the charging is finished, the hot-swap controller can provide an output indicating the power path is on (PATH_ON) to show that full current is available to the load. The on-state of a switch can be determined by monitoring its control signal. For the MOSFET switch 100, for example, this can be done with a hysteresis comparator 118 comparing the gate to source voltage of the MOSFET 100 with a threshold voltage produced by a voltage source 116 well above the MOSFET threshold voltage, for example, at 4.5 V.

The hot swap switch itself has resistance which is a source of power loss in the system. In MOSFET switches, this resistance is referred to as on-resistance. High power systems with large load currents have a significant power loss due to this on-resistance. Often, as illustrated in FIG. 2, conventional high current hot-swap circuits use several MOSFETs 200, 203 (Q1 and Q2) arranged in parallel to achieve a low on-resistance that is unavailable using a single MOSFET. The hot swap circuit in FIG. 2 uses current and power control circuitry elements 202, 204, 206, 208 210, 212, 216, 218, 225, 226 similar to the respective elements in FIG. 1.

At high power levels it is difficult to find MOSFETs with both sufficient SOA capability and low enough on-resistance to serve as hot swap switches. High SOA capability is strongly linked to the amount of die area in a MOSFET that can dissipate the power. Most modern MOSFET production focuses on reducing both die area and on-resistance, which also reduces SOA capability. MOSFET processes with high SOA generally have high on-resistance per unit die area. Conversely, MOSFETS with low SOA tend to have low on-resistance per unit area. For high power applications, achieving the necessary SOA in a single MOSFET is often neither practical nor economical.

Using multiple MOSFETs in parallel reduces the combined on-resistance, but does not necessarily increase the SOA. Parallel MOSFETs share current well when their channels are fully enhanced because the MOSFET on-resistance has a positive temperature coefficient. However, when limiting current parallel MOSFETs usually operate in saturation with high drain to source voltages. They do not share current well because their threshold voltages are not matched and have a negative temperature coefficient. This allows the MOSFET with the lowest threshold voltage to carry more current than the others. As this MOSFET heats it tends to carry even more current as its threshold voltage drops further. Thus, all of the load current may be carried by a single MOSFET. For this reason, when a group of parallel MOSFETs operate to limit current, they can only be relied on to have the SOA of a single MOSFET.

Not all loads can be turned off during startup and inrush. A gate capacitor will limit inrush current to load capacitance. However, it does not limit current flowing to a resistive load or resistive fault across the load. This additional current adds to the stress imposed on the MOSFET switch and increases the required SOA.

Therefore, it would be desirable to develop inrush current control circuitry and methodology for controlling multiple switches so as to overcome the above discussed disadvantages.

SUMMARY

The present disclosure presents a novel system for supplying power from an input node to a load coupled to an output node.

In accordance with one aspect of the disclosure the system includes first and second switches coupled between the input node and the output node, a first limiting circuit configured for controlling the first switch so as to limit an output of first switch, and a second limiting circuit configured for controlling the second switch so as to limit an output of the second switch. The second limiting circuit is configured to operate independently of the first limiting circuit. For example, the first limiting circuit may limit current though the first switch, and the second limiting circuit may limit current through the second switch. A logic circuit is provided to produce an output signal in response to first and second status signals. The first status signal indicates that the first limiting circuit is limiting the output of the first switch, and the second status signal indicates that the second current limit circuit is limiting the output of the second switch. The logic circuit produces an output signal after receiving both the first status signal and the second status signal.

A timer circuit responsive to the output signal of the logic circuit may indicate a fault condition after expiration of a delay period.

A first current sense element may be arranged for sensing the current in the first switch, and a second current sense element may be provided for sensing the current in the second switch.

The first limiting circuit may be responsive to the current sensed by the first sense element, and the second limiting circuit may be responsive to the current sensed by the second sense element.

The system may also have an indicative circuit for producing a path on signal indicating that a power path provided between the input node and the output node is turned on. The indicative circuit may include a first detecting circuit for detecting that the first switch is in an on state, and a second detecting circuit for detecting that the second switch is in an on state.

The indicative circuit may be configured for producing the path on signal when either both the first and second switches are in an on state, or when one of the first and second switches is in an on state and a current limit circuit associated with the other of the first and second switches is in a current limit mode.

In an exemplary embodiment, the first switch may be coupled between the input node and the output node, and the second switch may be coupled in parallel to the first switch between the input node and the output node. The first and second switches may be turned on or off at the same time. Both the first and second switches may be turned off after expiration of the delay period.

In accordance with another aspect of the disclosure, a system for supplying power from an input node to a load coupled to an output node may comprise first and second switches coupled between the input node and the output node, a first current limit circuit configured for controlling the first switch so as to limit current flowing through the first switch to a first value, and a second current limit circuit configured for controlling the second switch so as to limit a current flowing through the second switch to a second value greater than the first value.

The second switch may be maintained in an off state when the first switch is turned on, and the second switch may be turned on in response to a signal indicating that the first switch is in an on state. The second switch may be configured to provide a low resistance path for a load current around the first switch.

A first current sense element may be provided for sensing the current in the first switch, and a second current sense element may be provided for sensing the current in the second switch. The sensitivity of the first current sense element may be greater than the sensitivity of the second current sense element, where the current sense elements may be sense resistors and the sensitivity may correspond to electrical resistance of the respective resistors. The first current limit circuit may be responsive to the current sensed by the first sense element, and the second current limit circuit may be responsive to the current sensed by the second sense element.

The system may further has a timer circuit including a first timer configured to initiate a first delay period in response to a first status signal indicating that the first current limit circuit begins operation in a current limit mode to limit the current through the first switch, and a second timer configured to initiate a second delay period in response to a second status signal indicating that the second current limit circuit begins operation in a current limit mode to limit the current through the second switch. The first delay period may be longer than the second delay period. The timer circuit may be configured to indicate a fault condition after expiration of the first delay period or the second delay period.

The indicative circuit may be configured to produce the path on signal when the second switch is in an on state, without detecting the state of the first switch.

In accordance with a further aspect of the disclosure, a system for supplying power from an input node to a load coupled to an output node comprises first and second switches coupled between the input node and the output node, where the first switch is configured to dissipate more power than the second switch. A single limiting circuit may be configured for controlling the first switch so as to limit an output of the first switch, without regulating an output of the second switch. For example, the single limiting circuit may be configured for controlling the first switch so as to limit current through the first switch when the second switch is turned off.

The second switch may be maintained in an off state when the first switch is turned on, and the second switch may be turned on when the first switch is in an on state and a voltage across the second switch is below a threshold level. The second switch may be configured to provide a low resistance path for a load current around the first switch. The second switch may be turned off when a voltage across the second switch exceeds a threshold level, a gate to source voltage of the first switch falls below a threshold level, or the first switch is turned off.

The indicative circuit may be configured to produce the path on signal when the first switch is in an on state, without detecting the state of the second switch.

Additional advantages and aspects of the disclosure will become readily apparent to those skilled in the art from the following detailed description, wherein embodiments of the present disclosure are shown and described, simply by way of illustration of the best mode contemplated for practicing the present disclosure. As will be described, the disclosure is capable of other and different embodiments, and its several details are susceptible of modification in various obvious respects, all without departing from the spirit of the disclosure. Accordingly, the drawings and description are to be regarded as illustrative in nature, and not as limitative.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein.

DETAILED DESCRIPTION

The present disclosure provides separate control circuits for controlling multiple MOSFETs. Such control allows multiple MOSFETs to be operated in parallel simultaneously or started up in stages with time delays between the stages. This allows the heating stress on the MOSFETs to be spread across multiple MOSFETs either simultaneously, or separated in time.

In accordance with the present disclosure, separate control circuits for each switch can spread the power dissipation between the switches. The SOA capability of each switch is used more efficiently. Turning switches on at different times allows different MOSFETs to be used during startup inrush, input voltage step inrush, and when the load current is turned on. MOSFETs optimized for these different operating modes can be less expensive than MOSFETs required to handle all operating modes.

The present disclosure will be made using specific examples of hot-swap controllers presented in FIGS. 3, 4 and 5. However, the disclosure is applicable to any switching circuits for supplying power to a load.

Figure 1:
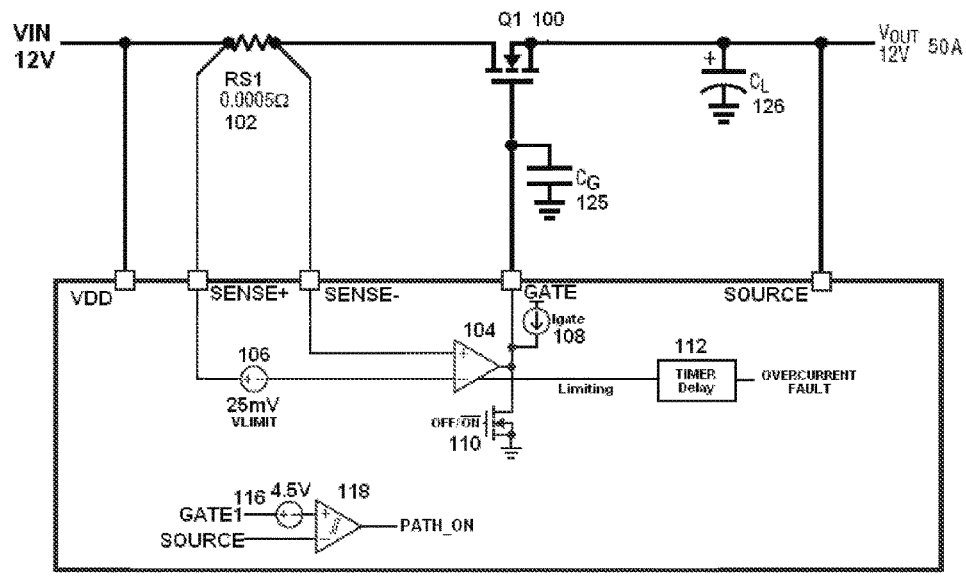
FIGS. 1 and 2 illustrate conventional hot swap controllers.
Figure 2:
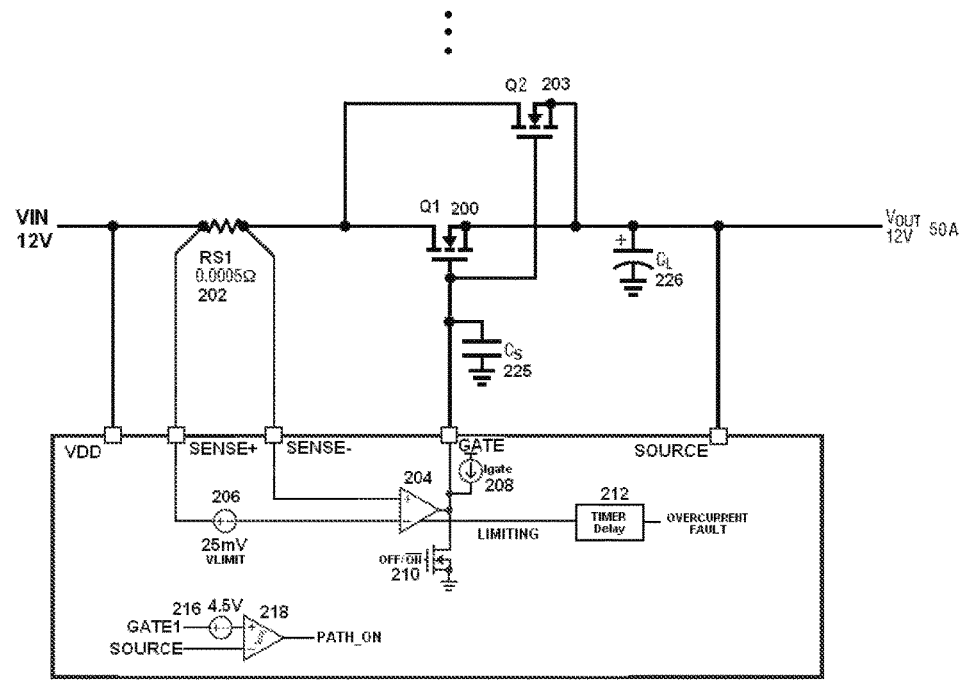
Figure 3:
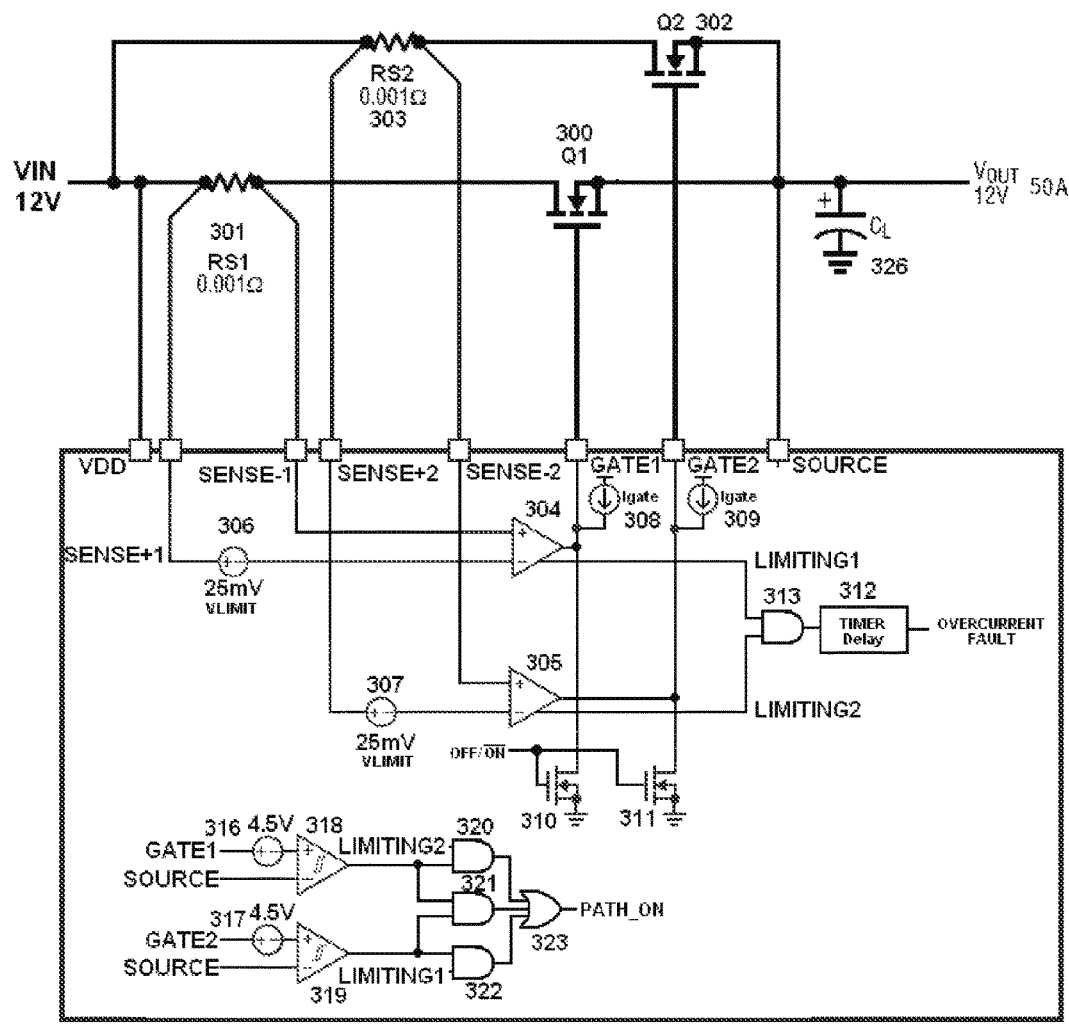
FIG. 3 illustrates a first exemplary embodiment of a hot swap controller in accordance with the present disclosure.

FIG. 3 shows an exemplary embodiment of a hot-swap controller with two MOSFETs 300 and 302 simultaneously operating in parallel. Each MOSFET 300 and 302 is independently controlled using the respective current sense resistor 301 and 303, and the respective current limit amplifier 304 and 305. The current sense resistor 301 is coupled between positive node SENSE+1 and negative node SENSE−1 representing the MOSFET 300, and the current sense resistor 303 is coupled between positive node SENSE+2 and negative node SENSE−2 representing the MOSFET 302. Each of the current limit amplifiers 304 and 305 controls the gate of the respective MOSFET 300 and 302 independently from the other amplifier so as to limit current at the output of the MOSFETs 300 and 302 when the current sensed in the respective resistors 301 and 303 exceeds the maximum current value defined by the VLIMIT voltage provided by respective voltage sources 306 and 307. Current sources 308 and 309 provide current to pull up the gate voltage of the MOSFETs 300 and 302, respectively. Transistors 310 and 311 are provided for turning on and off the respective MOSFETs 300 and 302.

Signals LIMITING 1 and LIMITING 2 respectively produced at status outputs of the current limit amplifiers 304 and 305 are supplied to respective inputs of an AND gate 313 that produces an output signal supplied to a timer 312 that sets a delay period for indicating an overcurrent fault condition.

When limiting current, the independent gate control provided by the current limit amplifiers 304 and 305 divides the current and stress accurately between the MOSFETs 300 and 302 despite any mismatch in their threshold voltages or temperatures. Thus, for a given load power, one can use two smaller and less expensive MOSFETs. Board resistance, amplifier offset and mismatch effects can cause one of the current limit amplifiers 304 and 305 to limit current at a lower level than the second current limit amplifier. Since the MOSFET associated with the second current limit amplifier remains fully on, keeping drain to source voltage (VDS) low for both MOSFETs 300 and 302, neither MOSFET will suffer significant heating in this state. The combined impedance of the switches 300 and 302 is still low and the load may continue operating.

Only when the load current increases to a point where both MOSFETs 300 and 302 have begun limiting current, the VDS and the dissipated power begin to increase, requiring the MOSFETS to be shut off for protection. Due to the AND gate 313, the timer 312 is initiated only when both LIMITING 1 and LIMITING 2 signals are produced, i.e. when both of the current amplifiers 304 and 305 are operating to limit the current. When the delay period established by the timer 312 expires, an overcurrent fault signal is produced to indicate that both MOSFETs 300 and 302 should be turned OFF.

Further, the hot swap circuitry in FIG. 3 may include a circuit for producing a signal PATH_ON indicating that the power path is on, so as to show that full current is available to the load. This circuit includes threshold voltage sources 316, 317, hysteresis comparators 318, 319, AND gates 320, 321, 322 and an OR gate 323. The comparator 318 monitors when the gate to source voltage of the MOSFET 300 exceeds a threshold voltage produced by a voltage source 316, and the comparator 319 indicates when the gate to source voltage of the MOSFET 302 exceeds a threshold voltage produced by a voltage source 317. Both threshold voltages may be set well above the MOSFET threshold voltage, for example, at 4.5 V.

One input of the AND gate 320 receives the output signal of the comparator 318, the other input of the AND gate 320 is supplied with the LIMITING 2 signal. The AND gate 321 is supplied with the output signals of the comparators 318 and 319. One input of the AND gate 322 receives the output signal of the comparator 319, whereas the other input of the AND gate 322 is supplied with the LIMITING 1 signal. The outputs of the AND gates 320, 321 and 322 are coupled to respective inputs of the OR gate 323. As a result, the OR gate 323 asserts the PATH_ON signal when either both MOSFETs are fully on, or if one of the MOSFETs is fully on while the other MOSFET operates in a current limit mode. The PATH_ON signal will be low if either of the MOSFETs 300 and 302 is turned off. Also, FIG. 3 shows a bypass capacitor 326 provided at the load.

Figure 4:
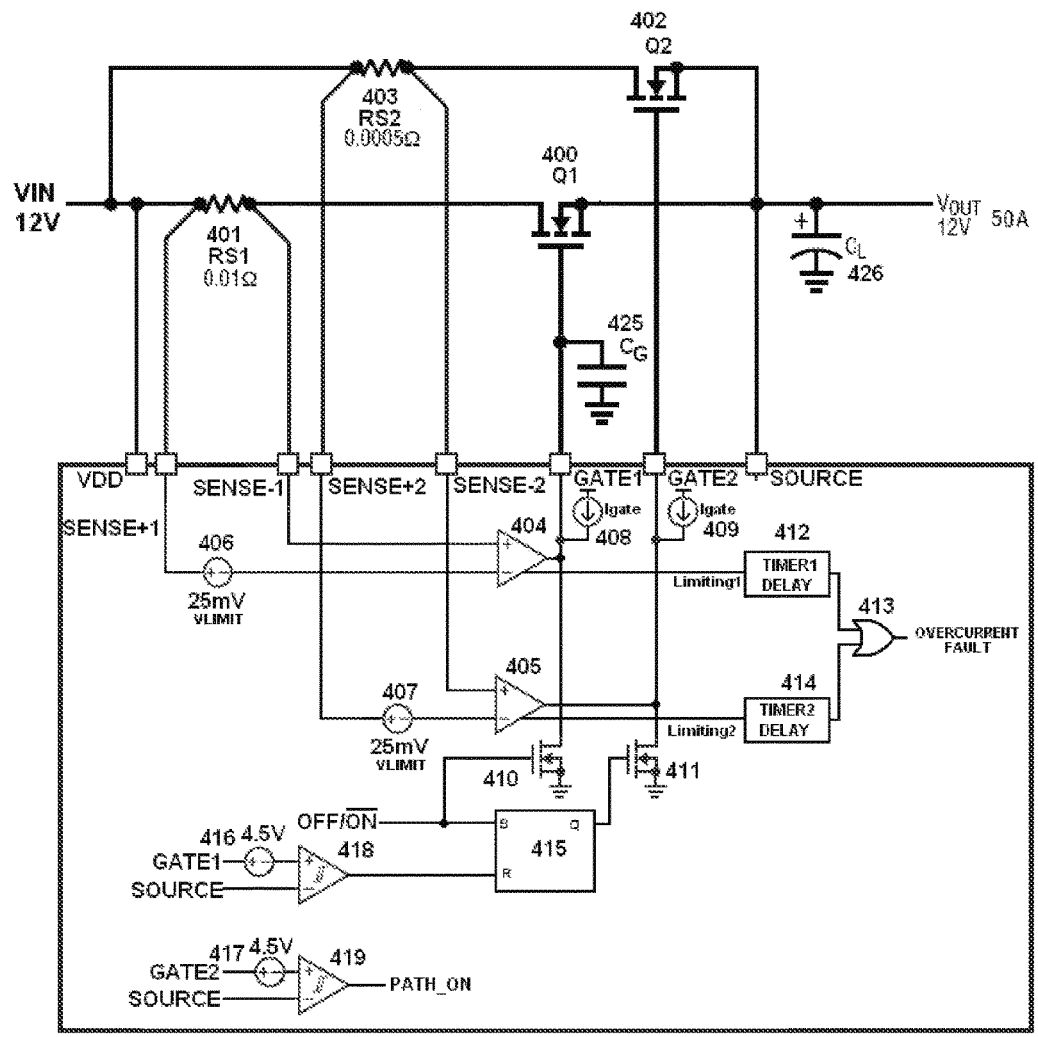
FIG. 4 illustrates a second exemplary embodiment of a hot swap controller in accordance with the present disclosure.

In applications where inrush current can be limited to low levels, the parallel MOSFETs can be operated in stages, as shown in FIG. 4 that presents an exemplary embodiment of a hot-swap controller with parallel MOSFETS 400 and 402. The MOSFET 400 may dissipate less power than the MOSFET 402. In particular, the MOSFET 400 operates as a startup MOSFET to bring up the load voltage and charge the load capacitance 426 while the load is held in a low current state. This allows the MOSFET 400 to have a high on-resistance, small current limit, and low SOA. Thus, the MOSFET 400 can be small and inexpensive. As discussed below, the MOSFET 402 operates as a shunt MOSFET which is turned on only after the startup MOSFET 400 is fully turned on.

The hot swap controller in FIG. 4 includes current sense resistors 401 and 403 and the respective current limit amplifiers 404 and 305. The current sense resistor 401 is coupled between positive node SENSE+1 and negative node SENSE−1 to allow measurement of the current through the MOSFET 400, and the current sense resistor 403 is coupled between positive node SENSE+2 and negative node SENSE−2 to allow measurement of the current through the MOSFET 402. The current sense resistor 401 may have a much higher resistance that the resistance of the current sense resistor 403 so as to operate the MOSFET 400 at a smaller current limit than the MOSFET 402.

The current limit amplifiers 404 and 405 control gates of the respective MOSFET 400 and 402 so as to limit current at the output of the MOSFETs 400 and 402 when the current sensed in the respective resistors 401 and 403 exceeds the maximum current value defined by the respective VLIMIT sources 406 and 407. Current sources 408 and 409 provide current to pull up the gate voltage of the MOSFETs 400 and 402, respectively. Transistors 410 and 411 are controlled for turning on and off the respective MOSFETs 400 and 402.

The circuit in FIG. 4 may also include timers 412 and 414, an OR gate 413, an RS latch circuit 415, voltage sources 416 and 417, hysteresis comparators 418 and 419. A gate capacitor 425 may be coupled between the gate of the MOSFET 425 and ground to obtain the low charging current. A bypass load capacitor 426 may be coupled across the load.

Signals LIMITING 1 and LIMITING 2 respectively produced at status outputs of the current limit amplifiers 404 and 405 are supplied to timers 412 and 414. A delay period defined by the timer 412 associated with the startup MOSFET 400 may be longer than the delay period of the timer 414 associated with the MOSFET 402.

After the startup MOSFET 400 has turned on completely, the shunt MOSFET 402 is turned on. The latch circuit 415 holds off the MOSFET 402 until the comparator 418 detects that the MOSFET 400 is on by determining that its gate to source voltage has exceeded a threshold voltage. The shunt MOSFET 402 provides a low resistance path for the load current around the MOSFET 400.

Because the shunt MOSFET 402 is turned on when its VDS is small, it does not need a large SOA. It may also require a shorter delay period provided by the timer 414, corresponding to its smaller SOA. By applying power in stages with two MOSFETS 400 and 402, the SOA requirements of both MOSFETs are reduced and the on-resistance requirement of the MOSFET 400 can be larger. A PATH_ON signal indicating that the power path is on is produced by the comparator 419 when the gate to source voltage of the shunt MOSFET 402 has exceeded a threshold voltage, indicating that the low resistance channel is fully on and capable of supporting load current.

Some applications have loads that are always on, even during startup, or are subject to input steps and output surges that put additional stress on the hot-swap MOSFET. In such cases, the parallel MOSFETs in a hot-swap controller can be operated in stages as shown in FIG. 5 that presents an exemplary embodiment of a hot-swap controller including MOSFETS 500 and 502, a single sense resistor 501 shared by both MOSFETs 500 and 502, and a single current limit amplifier 504 controlling the gate of the MOSFET 500 so as to limit its output current based on the voltage across the sense resistor 501 and the VLIMIT voltage produced by a voltage source 506. Current sources 508 and 509 provide current to pull up the gate voltage of the MOSFETs 500 and 502, respectively. Transistors 510 and 511 are controlled for turning on and off the respective MOSFETs 500 and 502. A timer 512 is coupled to the current limit amplifier 504 for detecting when it enters a current limit mode so as to assert an overcurrent fault condition signal after a delay period set by the timer 512 expires.

Figure 5:
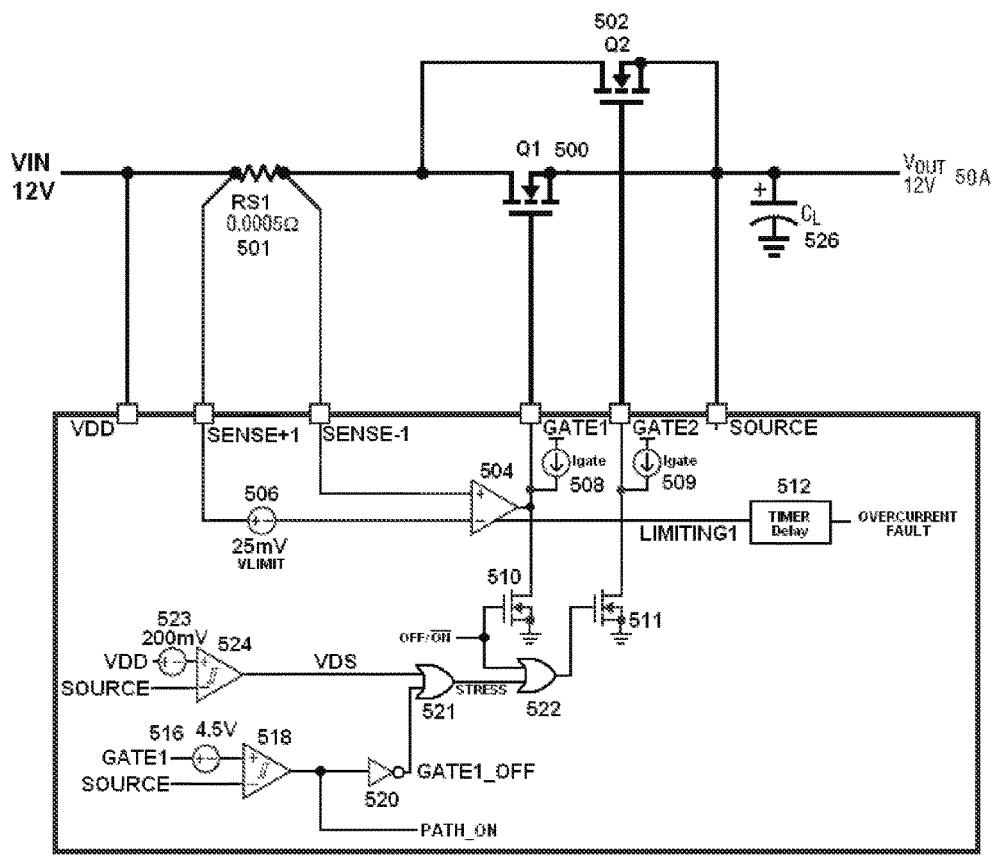
FIG. 5 illustrates a third exemplary embodiment of a hot swap controller in accordance with the present disclosure.

The hot-swap controller in FIG. 5 also includes a hysteresis comparator 518 monitoring the gate to source voltage of the MOSFET 500 with respect to a threshold voltage produced by a voltage source 516. The output of the comparator 518 producing the PATH_ON signal is coupled to an inverter 520 that supplies a GATE1_OFF signal to an input of an OR gate 521. The output of the OR gate 521 produces a STRESS signal supplied to an input of an OR gate 522 that controls the gate of the transistor 511. The other input of the OR gate 522 is provided with an OFF/ON# signal that turns on and off the MOSFET 500. A hysteresis comparator 524 monitors the drain to source voltage of the MOSFETs 500 and 502 with respect to a threshold voltage produces by a voltage source 523, and supplies an output signal to an input of the OR gate 521 that produces the STRESS signal.

The MOSFET 500 operates as a stress MOSFET to charge the load capacitance 526 and bring up the load voltage. It provides the load current during transients with limited durations such as startup and changes in input voltage. The MOSFET 500 has higher power dissipation than the MOSFET 502. The MOSFET 500 operates with both large current and large VDS, and has a high SOA rating. However, the MOSFET 500 does not require low on-resistance because it supports the load current only during limited duration transients. It may also require a long delay time provided by the timer 512.

The MOSFET 502 operates as a shunt MOSFET to provide a low resistance path for the load current around the MOSFET 500 when conditions are stable and not changing. The MOSFET 502 is turned off by the signal STRESS to protect it whenever the VDS exceeds the threshold voltage provided by the voltage source 523 or if the gate to source voltage of the MOSFET 500 is below the threshold voltage provided by the voltage source 516, for example, when the MOSFET 500 operates in a current limit mode. The threshold voltage defined by the voltage source 523 may be set, for example, at 200 mV, and the threshold voltage of the voltage source 516 may be set, for example, at 4.5 V.

The MOSFET 502 is only turned on when the STRESS signal is low, indicating that the MOSFET 500 is fully turned on and the VDS is below the threshold voltage defined by the voltage source 523. Therefore, the MOSFET 502 can have very low on-resistance. Because the MOSFET 502 is turned on with low VDS, it does not need a large SOA. The MOSFET 502 never operates in saturation, so several parallel MOSFETs may be used instead of the MOSFET 502 to achieve low on-resistance. The PATH_ON signal produced by the comparator 528 is derived from the on-state of the stress MOSFET 500. Whenever the MOSFET 500 is on, the load is allowed to draw power.

Hence, the present disclosure makes it possible to improve SOA performance of a hot-swap controller using parallel MOSFETs that are separately controlled.

Gate to source voltage levels of MOSFETs may be used as a condition to determine if a switch in the hot-swap controller is on. Alternatively, drain to source voltage levels of MOSFETs may be used as a condition to determine if a switch in the hot-swap controller is on. Combinations of switch on signals may be used for producing a PATH_ON signal to indicate if load current can be turned on.

Although two switch paths are shown in exemplary embodiments in FIGS. 3-5, the configuration of the hot-swap controller can be extended to more parallel switch paths.

Also, a single MOSFET switch per path is shown in FIGS. 3-5. However, each of these paths may use multiple MOSFET switches in parallel.

In addition, although N-type MOSFET switches are shown in the presented exemplary embodiments, the switches may be implemented with other devices, such as PMOS transistors, bipolar transistors, IGBTs or relays.

Further, the STRESS signal for the exemplary embodiment in FIG. 5 may be generated by monitoring the gate to source voltage, drain to source voltage, or detecting current limit in the STRESS MOSFET, or shunt MOSFET temperature, alone or in combination.

The indication that a MOSFET is on can be derived by monitoring its gate to source voltage or its drain to source voltage, alone or in combination. Also, separate switch control circuits presented in FIGS. 3, 4 and 5 may be used for controlling switches arranged in series, rather than in parallel, as shown in the exemplary embodiments.

The foregoing description illustrates and describes aspects of the present invention. Additionally, the disclosure shows and describes only preferred embodiments, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein.

What is claimed is:

1. A system for limiting in-rush power to a load, the system comprising:
    a control circuit configured to, based on an amount of power provided to the load by a first switch when the first switch is turned on, adjust a first switch control signal generated to control the first switch to limit the power provided to the load by the first switch, the control circuit configured to, responsive to a value of the first switch control signal having exceeded a threshold value, generate a second switch control signal to initiate switching on a second switch to share at least a portion of the power provided to the load by the first switch;
    wherein the control circuit is configured to adjust, responsive to an amount of a portion of the power provided to the load by the second switch, the second switch control signal generated to control the second switch to limit the portion of the power provided to the load by the second switch independently of the first switch.

2. The system of claim 1, wherein the control circuit is configured to adjust the first switch control signal based on an amount of current flowing through a load current path of the first switch to the load, and the control circuit is configured to adjust the second switch control signal based on an amount of current flowing through a load current path of the second switch to the load.

3. The system of claim 2, wherein the first switch control signal is a gate to source voltage associated with the first switch and the second switch control signal is a gate to source voltage associated with the second switch, and wherein respective first and second amplifiers are configured to receive respective signals indicative of the respective load currents flowing through the respective load current paths, the first amplifier providing the first switch control signal and the second amplifier providing the second switch control signal.

4. The system of claim 3, further comprising:
    a comparator configured to compare the source voltage associated with the first switch with a reference voltage and to, based on comparing the source voltage associated with the first switch with the reference voltage, generate a comparator signal indicative of whether the first switch control signal exceeded the threshold value.

5. The system of claim 4, wherein the control circuit comprises:
    a latch circuit configured receive the comparator signal and to generate a second switch control signal to hold the second switch in an off state until the comparator signal indicates that the first switch is turned on based on the first switch control signal exceeding the threshold value.

6. The system of claim 1, wherein the control circuit is configured to produce a first limiting signal when the power provided to the load by the first switch is being limited, and wherein the control circuit is configured to produce a second limiting signal when the portion of power provided to the load by the second switch is being limited, the system further comprising:
    a first timer configured to detect the first limiting signal and to trigger an overcurrent fault signal on detecting the first limiting signal for a first length of time; and
    a second timer configured to detect the second limiting signal and to trigger the overcurrent fault signal on detecting the second limiting signal for a second length of time, the first length of time being longer than the second length of time.

7. A system for limiting in-rush power to a load, the system comprising:
    control circuit configured to, based on an amount of power provided to the load by a first switch when the first switch is turned on, adjust a first switch control signal generated to control the first switch to limit the power provided to the load by the first switch;
    wherein the control circuit configured to generate a second switch control signal to initiate switching on of the second switch, to share at least a portion of the power provided to the load by the first switch, responsive to a value of the first switch control signal having exceeded the threshold value and an amount of power provided to the load by the first switch and the second switch being below a threshold amount of power.

8. A method for limiting inrush power to a load, the method comprising:
    adjusting, based on an amount of power provided to the load by a first switch when the first switch is turned on, a first switch control signal provided to the first switch to limit the power provided to the load by the first switch;
    generating, responsive to a value of the first switch control signal having exceeded a threshold value, a second switch control signal to control a second switch to share at least a portion of the power provided to the load by the first switch; and adjusting, responsive to an amount of a portion of the power provided to the load by the second switch, the second switch control signal provided to the second switch to limit the portion of the power provided to the load by the second switch independently of the first switch.

9. The method of claim 8, wherein adjusting the first switch control signal based on the amount of power provided by the first switch comprises adjusting the first switch control signal based on an amount of current flowing through a load current path of the first switch to the load, and wherein adjusting the second switch control signal based on the amount of power provided by the second switch comprises adjusting the second switch control signal based on an amount of current flowing through a load current path of the second switch to the load.

10. The method of claim 9, wherein the first switch control signal is a gate to source voltage associated with the first switch and the second switch control signal is a gate to source voltage associated with the second switch, the respective currents flowing through the respective load current paths being measured across respective sense resistors along the respective load current paths by respective first and second amplifiers, the first amplifier providing the first switch control signal and the second amplifier providing the second switch control signal.

11. The method of claim 10, further comprising:
comparing a source voltage of the first switch with a reference voltage corresponding to the threshold value and, based on comparing a source voltage of the first switch with the reference voltage, generating a comparator signal indicative of whether the first switch control signal exceeded the threshold value.

12. The method of claim 11, further comprising:
receiving the comparator signal; and
holding the second switch in an off state until the comparator signal indicates that the first switch is turned on based on the first switch control signal exceeding the threshold value.

13. The method of claim 8, further comprising:
producing a first limiting signal indicative that the power provided to the load by the first switch is being limited;
producing a second limiting signal indicative that the portion of power provided to the load by second switch is being limited; and
triggering an overcurrent fault signal responsive to at least one of:
detecting the first limiting signal for a first length of time; or
detecting the second limiting signal for a second length of time;
wherein the first length of time is longer than the second length of time.

14. A method for limiting in-rush power to a load, the method comprising:
adjusting, based on an amount of power provided to the load by a first switch when the first switch is turned on, a first switch control signal provided to the first switch to limit the power provided to the load by the first switch; and
generating a second switch control signal to control a second switch, to share at least a portion of the power provided to the load by the first switch, responsive to a value of the first switch control signal having exceeded a threshold value and an amount of power provided to the load by the first switch and the second switch being below a threshold amount of power; and
initiating switching off of the second switch using the second switch control signal, responsive to the amount of power provided to the load by the first switch and the second switch being above the threshold amount of power or the value of the first switch control signal being below the threshold value.

15. A system for limiting in-rush power to a load, comprising:
a control circuit configured to, based on a first amount of power provided to the load by a first switch when the first switch is turned on, adjust a first switch control signal generated to control the first switch to limit the first amount of power provided to the load by the first switch, the a control circuit configured to, based on a second amount of power provided to the load by a second switch, adjust a second switch control signal generated to control a second switch to limit the second amount of power provided to the load by the second switch; and
wherein the control is configured to detect when the first amount of power is being limited by the first switch and the second amount of power is being limited by the second switch, and to trigger an overcurrent fault signal responsive to detecting that the first amount of power is being limited by the first switch and the second amount of power is being limited by the second switch.

16. The system of claim 15, wherein the control circuit is configured to produce a first limiting signal when the power provided to the load by the first switch is being limited, and wherein the control circuit is configured to produce a second limiting signal when the second amount of power provided to the load by the second switch is being limited, and
wherein the control circuit comprises a timer circuit configured to:
detect when the first limiting signal and the second limiting signal are produced by the the control circuit;
initiate a timer responsive to detecting the first limiting signal and the second limiting signal; and
trigger the overcurrent fault signal on an expiration of a predetermined delay period as indicated by the timer.

17. The system of claim 15, wherein the control circuit is configured to, responsive to a value of the first switch control signal having exceeded a threshold value, generate the second switch control signal to initiate switching on the second switch to share in providing power to the load.

18. The system of claim 17, wherein the control circuit is further configured to:
generate the second switch control signal to initiate the switching on of the second switch responsive to a value of the first switch control signal having exceeded the threshold value and the power provided to the load by the first switch and the second switch being below a threshold amount of power; and
generate the second switch control signal to initiate the switching off of the second switch responsive to the power provided to the load by the first switch and the second switch being above the threshold amount of power or the value of the first switch control signal being below the threshold value.

19. A method for limiting in-rush power to a load, comprising:

adjusting, based on a first amount of power provided to the load by a first switch when the first switch is turned on, a first switch control signal provided to the first switch to limit the first amount of power provided to the load by the first switch;

adjusting, based on a second amount of power provided to the load by a second switch when the second switch is turned on, a second switch control signal provided to the second switch to limit the second amount of power provided to the load by the second switch;

detecting when the first amount of power is being limited by the first switch and the second amount of power is being limited by the second switch; and triggering an overcurrent fault signal responsive to detecting that the first amount of power is being limited by the first switch and the second amount of power is being limited by the second switch.

20. The method of claim 19, further comprising:

initiating a timer responsive to detecting the first amount of power is being limited by the first switch and the second amount of power is being limited by the second switch; and triggering the overcurrent fault signal on an expiration of a predetermined delay period as indicated by the timer.

21. The method of claim 19, further comprising:

generating the second switch control to initiate, responsive to a value of the first switch control signal having exceeded a threshold value, switching on of the second switch to share the power provided to the load.

22. The method of claim 19, further comprising:

generating the second switch control a initiate a switching on of the second switch responsive to a value of the first switch control signal having exceeded a threshold value and the power provided to the load by the first switch and the second switch being below a threshold amount of power; and generating the second switch control to initiate the switching off of the second switch responsive to the power provided to the load by the first switch and the second switch being above the threshold amount of power or the value of the first switch control signal being below the threshold value.

* * * * *